(12) United States Patent
Sommer et al.

(10) Patent No.: US 8,394,312 B1
(45) Date of Patent: Mar. 12, 2013

(54) METHOD FOR FORMING POLYMERIZED MICROFLUIDIC DEVICES

(75) Inventors: Gregory J. Sommer, Livermore, CA (US); Anson V. Hatch, Tracy, CA (US); Ying-Chih Wang, Pleasanton, CA (US); Anup K. Singh, Danville, CA (US); Ronald F. Renzi, Tracy, CA (US); Mark R. Claudnic, Livermore, CA (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 13/237,027

(22) Filed: Sep. 20, 2011

Related U.S. Application Data

(62) Division of application No. 12/321,881, filed on Jan. 26, 2009, now Pat. No. 8,047,829.

(51) Int. Cl.
*B81B 7/00* (2006.01)
(52) U.S. Cl. ........................................ 264/494; 264/496
(58) Field of Classification Search .................. 264/494, 264/496
See application file for complete search history.

(56) References Cited

U.S. PATENT DOCUMENTS

| | | | |
|---|---|---|---|
| 6,485,625 B1 * | 11/2002 | Simpson et al. | 204/601 |
| 6,488,872 B1 | 12/2002 | Beebe | |
| 2007/0259366 A1 * | 11/2007 | Lawrence et al. | 435/6 |

FOREIGN PATENT DOCUMENTS

WO  WO2004009489 A2  1/2004

OTHER PUBLICATIONS

David J. Beebe; Jeffrey S. Moore; Qing Yu; Robin H. Liu, Mary L. Kraft; Byung-Ho Jo; Chelladurai Devadoss; "Microfluidic tectonics: A comprehensive construction platform for microfluidic systems", PNAS, 2000, vol. 97, No. 25, pp. 13488-13493.

Christopher Khoury; Glennys A. Mensing; David J. Beebe; "Ultra rapid prototyping of microfluidic systems using liquid phase photopolymerization", Lab Chip, 2002, vol. 2, pp. 50-55.

J. Brian Hutchinson; K. Tommy Haradlsson; Brian T. Good; Robert P. Sebra; Ning Luo, Kristi S. Anseth; Christopher N. Bowman; "Robust polymer microfluidic device fabrication via contact liquid photolithographic polymerization (CLiPP)", Lab Chip, 2004, vol. 4, pp. 658-662.

Neil B. Cramer; Sirish K. Reddy; Michael Cole; Charles Hoyle; Christopher N. Bowman; "Initiation and Kinetics of Thiol-ene Photopolymerizations without Photoinitiators", Journal of Polymer Science: Part A; Polymer Chemistry, 2004, vol. 42, pp. 5817-5826.

Helen M. Simms; Christopher M. Brotherton; Brian T. Good; Robert H. Davis; Kristi S. Anseth; Christopher N. Bowman; "In situ fabrication of macroporous polymer networks within microfluidic devices by living radical photopolymerization and leaching", Lab Chip, 2005, vol. 5, pp. 151-157.

(Continued)

*Primary Examiner* — Larry Thrower
*Assistant Examiner* — Xue Liu
(74) *Attorney, Agent, or Firm* — Dorsey & Whitney

(57) ABSTRACT

Methods for making a microfluidic device according to embodiments of the present invention include defining~cavity. Polymer precursor solution is positioned in the cavity, and exposed to light to begin the polymerization process and define a microchannel. In some embodiments, after the polymerization process is partially complete, a solvent rinse is performed, or fresh polymer precursor introduced into the microchannel. This may promote removal of unpolymerized material from the microchannel and enable smaller feature sizes. The polymer precursor solution may contain an iniferter. Polymerized features therefore may be capped with the iniferter, which is photoactive. The iniferter may aid later binding of a polyacrylamide gel to the microchannel surface.

13 Claims, 4 Drawing Sheets

OTHER PUBLICATIONS

K. Tommy Haraldsson; J. Brian Hutchison; Robert P. Sebra; Brian T. Good; Kristi S. Anseth; Christopher N. Bowman; "3D polymeric microfluidic device fabrication via contact liquid photolithographic polymerization (CLiPP)", Sensors and Actuators B 113, 2006, pp. 454-460.

Kyongmi Chon; Jihee Moon; Suhan Kim; Sang-Don Kim; Jaeweon Cho; "Bio-particle separation using microfluidic porous plus for environmental monitoring", Science Direct, Desalination 202, 2007, pp. 215-223.

\* cited by examiner

METHOD FOR FORMING POLYMERIZED MICROFLUIDIC DEVICES

CROSS REFERENCE TO RELATED APPLICATIONS

This application is a divisional application of prior co-pending U.S. application Ser. No. 12/321,881 filed Jan. 26, 2009 now U.S. Pat. No. 8,047,829 entitled "Method for Forming Polymerized Microfluidic Devices," to which priority is hereby claimed and the disclosure of which is herein incorporated in its entirety.

STATEMENT-REGARDING RESEARCH & DEVELOPMENT

The United States Government has a paid-up license in this invention and the right in limited circumstances to require the patent owner to license others on reasonable terms as provided for by the terms of contract No. DE-AC04-94AL85000 awarded by the U.S. Department of Energy to Sandia Corporation.

TECHNICAL FIELD

Embodiments of the invention relate generally to microfluidic devices, and more specifically to microfluidic devices and methods for making micro fluidic devices containing photopolymerized polymeric features.

BACKGROUND OF THE INVENTION

A variety of fabrication techniques may be utilized to create devices with micro fluidic channel structures. Generally, a microfluidic channel is a channel defined by a material and having a channel dimension of 1 mm or less. Microfluidic channels may be defined by a variety of materials including etched glass, silicon, molded polydimethylsiloxane (PDMS), and molded or embossed plastic. The microchannels themselves may be formed by etching away portions of the material, by embossing, or by building up a microchannel structure through the deposition of patterned layers. The material used and channel formation technique may be chosen based on the cost of fabrication and whether the resultant device will have the feature dimensions and material compatibility desired in a particular application.

Devices made using etching processes are generally costly, but may achieve accurate dimensions and be well-suited to a variety of applications. PDMS and plastic devices may be less costly but less well defined and may have heterogeneous chemical properties subject to temporal variation within the device. In addition, PDMS, as a porous material, may be prone to reagent evaporation through the material and may be unsuitable for long term device storage.

It may be desirable to control one or more interior surfaces of microchannels to be able to control the surface charge, hydrophobicity, binding sites, or other material linkages to the microchannel surface. Methods for controlling the surface reactivity of PDMS and plastic microchannels may not be as well developed as those for glass surfaces that can be treated by self assembly of silane monolayers. For example, a reactive surface chemistry may be needed to enable the later attachment of other materials or structures, such as polyacrylamide gels. For some applications in plastic, plasma surface treatments may be used to modify the chemistry of surfaces. However, the plasma surface treatments may result in a low density of reactive chemical groups, heterogeneous and undefined reactive groups, and non-uniform surface coverage of reactive groups, which may be problematic. In addition, undesired surface properties such as introduction of non-reactive charged groups during surface treatment can be problematic. For example, these surface treatment problems may result in undesired electroosmotic fluid flow or undesired chemical interactions with fluid constituents in some cases.

Examples of forming polymeric microdevices using photopolymerization is described in U.S. Pat. No. 6,488,872 entitled "Micro fabricated devices and method of manufacturing the same," which patent is hereby incorporated by reference in its entirety for any purpose. A liquid phase monomer solution including a photoinitiator may be loaded into a cartridge, and microchannels defined by polymerizing regions of the solution by exposing them to UV light U.S. Pat. No. 6,488,872 further describes the later polymerization of hydrogels in the microchannels.

In a variety of applications, it may be desirable to place polyacrylamide gels at one or more locations in a micro channel. The polyacrylamide gels may be used as size exclusion membranes, concentration membranes, or binding sites for analytes. The polyacrylamide gels are generally formed by photopolymerizing a polymer solution. On exposure to light, the polymer solution is polymerized into a gel. However, in some cases, the hydrogel may not adhere adequately or at all to one or more the micro channel surfaces. The poor adhesion may be due to surface chemistry difficulties described above. Consequently, flow through the microchannel may be disrupted in the region of a partially adhered gel, and bubbles or unusual streaming patterns may result, disrupting the proper operation of the micro channel and gel. In some cases, it may not be feasible at all to attach the gel.

Examples of polymeric microdevices are also described in WO 2004/009489 entitled "Fabrication of 3D photopolymeric devices," which publication is hereby incorporated by reference for any purpose. Iniferters or iniferter precursors are added to the liquid phase monomer solution used to form microchannels to allow covalent bonding of subsequent layers of material to a polymer surface. Iniferters are incorporated into a liquid polymer composition used to define one or more microstructures prior to polymerization. Once polymerized, the resulting polymeric layer contains iniferter on the surface of the material which facilitates bonding of subsequent layers to the polymerized surface. In this manner, a micro channel surface may be formed having iniferters and a photopolymerized hydrogel may be adhered to the microchannel surface. The described systems utilize a photomask as an upper layer of the micro channel system during formation which is removed following polymerization, resulting in open micro channels which are later sealed. A chuck system is also described that may be used to set the thickness of the polymer layer between the photomask and the substrate on the chuck.

BRIEF DESCRIPTION OF THE DRAWINGS

The accompanying drawings, which are hereby incorporated into the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings.

DETAILED DESCRIPTION OF ONE OR MORE EMBODIEMNTS

Figure 1:
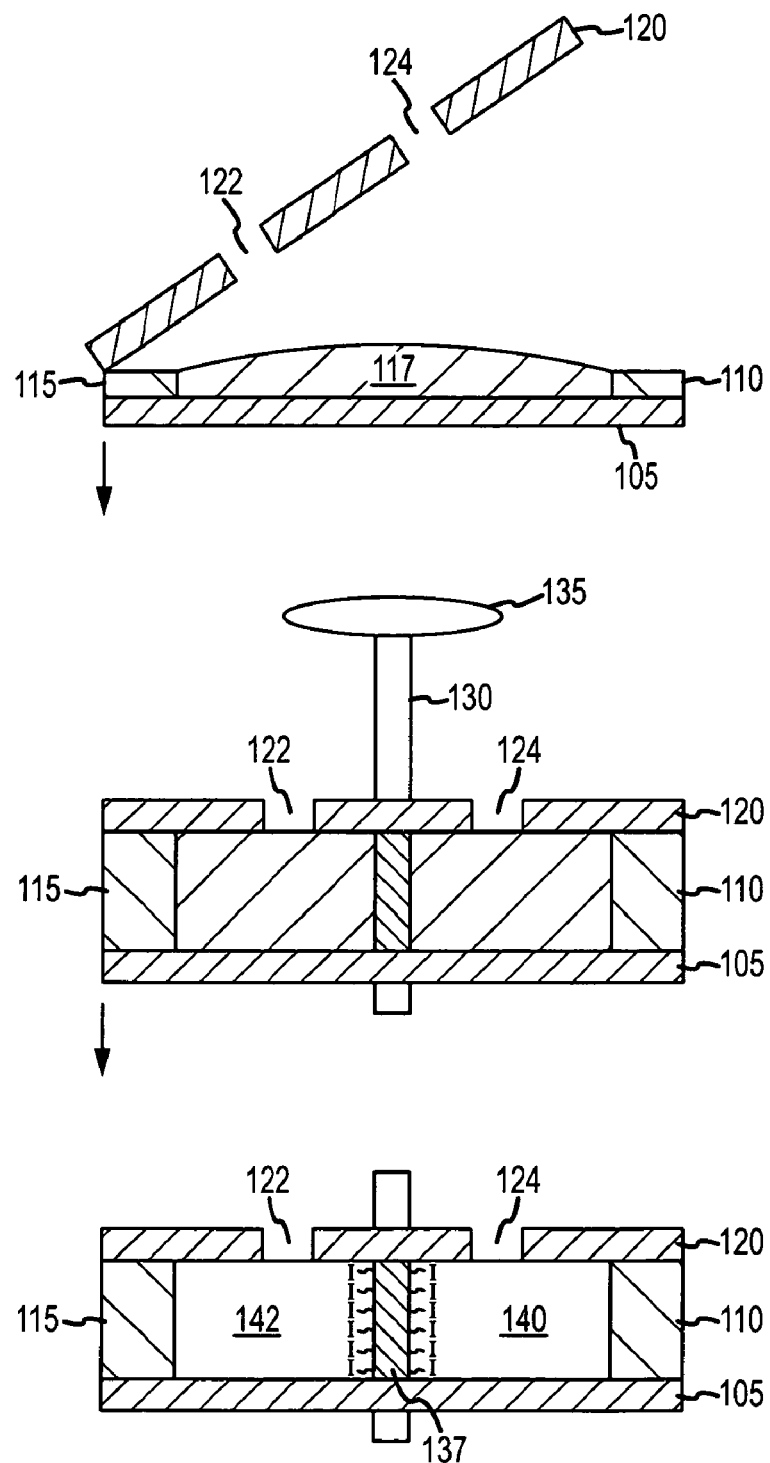
FIG. 1 is a schematic illustration showing cross-sections of a micro fluidic device fabricated in accordance with an embodiment of the present invention.

Certain details are set forth below to provide a sufficient understanding of embodiments of the invention. However, it will be clear to one skilled in the art that embodiments of the invention may be practiced without a number of these particular details. In some instances, well-known materials, chemical components, buffers or other additives, analytes, electrical components, material processing and fabrication techniques, have not been shown in detail in order to avoid unnecessarily obscuring the described embodiments of the invention.

As generally described above, polymeric microdevices may be formed by exposing a liquid monomer solution and photoinitiator to a suitable energy source. However, the technique as previously used may have some limitations. For example, the density and resolution of microchannel features may be limited by free radical propagation into the masked region of liquid monomer solution. Although the features are masked, energy from the photopolymerizing source may reflect, diffuse, or otherwise propagate into a region not intended to receive light exposure. This stray energy may polymerize additional material, resulting in an edge that is not as sharp, a feature that is not as fine as intended, or both. Furthermore, the liquid monomer solution may become more viscous as it polymerizes, making it difficult to remove partially polymerized solution from the microchannels, especially as the features become smaller or denser.

Methods for improving the adhesion of materials to a polymer microchannels surface using iniferters, described generally above, may aggravate these limitations. In particular, the monomer solution containing iniferters may require a longer exposure time for polymerization. Removing partially polymerized solution from the features accordingly may become even more difficult, as more partially polymerized solution may be generated. The removal of partially polymerized solution may be facilitated by utilizing a photomask as an upper layer during photopolymerization, removing the mask to reveal an open microchannel feature, and directly removing partially and unpolymerized material from a microchannel surface. However, this method may be cumbersome and in some cases prohibitive.

Embodiments of the present invention may address some of the above-described difficulties by providing methods, devices, and systems which are formed using liquid monomer solutions including iniferters. An upper device layer may be used instead of the photomask. As will be described further below, monomer solution may be flowed through the device during some or all of the photopolymerization time, which may facilitate removal of partially or unpolymerized solution from the device. Accordingly, smaller and denser features may be formed in some embodiments in a simple, effective manner. Of course, not all embodiments of the present invention may achieve all, or any, of these described benefits. Further, not all embodiments of the present invention may address all, or any, of the described limitations of previous devices.

FIG. 1 depicts a method of forming microfluidic devices having one or more microchannels according to an embodiment of the present invention. Cross-sectional views of a device are shown. A substrate 105 forms a base of the micro fluidic device. The substrate 105 may be formed of any suitable material including for example glass, fused silica, PDMS, or plastic. The substrate is completely or partially coated with reactive chemistry such that photopolymerized material may be grafted to the substrate during photopolymerization. Reactive silane chemistry may be used to coat glass, for example. A polymer substrate may be coated with photo-reactive iniferter or free-radical reactive acrylate or methacrylate, for example, or other surface chemistries may be used. PDMS or plastic could also be surface treated for example by plasma, but the resulting surface treatment may not be as desirable. In some embodiments, the substrate 105 itself may be formed from a polymerized polymer precursor material containing an iniferter, as described below. The substrate 105 may be polymerized in a mold or other process.

Spacers 110 and 115 are disposed on the substrate 105 and set a micro channel depth. The spacers 110 and 115 may be integral with the substrate 105, or bonded or otherwise connected to the substrate 105. The spacers 110 and 115 may form part of a contiguous layer of material on the substrate 105 or may be completely separate. Double sided pressure sensitive adhesive may form the spacers 110 and 115. The height of the spacers 110 and 115 may generally be selected according to a desired depth of the microchannel. Appropriate heights may range in one example 1 µm to 1 mm, 1 µm to 500 µm in some embodiments, and 10 µm to 300 µm in other embodiments.

The spacers 110 and 115, together with the substrate 105, define cavity 117 which is, filled with a liquid polymer precursor. The liquid polymer precursor placed in the cavity includes a monomeric solution which may be polymerized to form the micro channel, as will be described further below, an iniferter, and may further include a photoinitiator. Any of a variety of monomeric materials may be used to fill the cavity 117 and form microchannels, as will be described further below, including acrylamide, acrylates, methacrylates, styrenices, maleimides, vinyl ether/maleate mixtures, vinyl ether/fumarate mixtures, vinyl ether maleimides, and thiolene. The monomeric materials are mentioned as examples only, and others may also be used. In some examples, a photoinitiator may not be necessary to initiate polymerization, such as in some examples where the monomeric material includes thiol-ene.

The photo initiator species serves to generate free radicals on exposure to light and promote polymerization of the monomeric species. Any suitable iniferter may also be used. Suitable iniferters are described, for example in International Publication Number WO 2004/009489, entitled "Fabrication of 3D photopolymeric devices," which application is hereby incorporated by reference in its entirety. Generally, and without being bound by the described mechanism, the iniferter species may serve as a reaction initiator, transfer, and terminator. The iniferter is cleaved during the polymerization of the polymer precursor and a portion of the iniferter may be found at the end of the forming polymer. The iniferter may be photoactive, a photoiniferter, in that once light is removed from the photoiniferter, it caps the surface such that the surface is less reactive. On exposure to light, however, the photoiniferter no longer serves as a cap, and the surface is reactive and able to attach to subsequent material layers. Suitable iniferters include tetraethylthiuram disulfide (TED) and tetramethylthiuram disulfide (TMD). Other iniferters may also be used.

Examples of recipes for solutions useful to fill the cavity 117 according to embodiments of the invention will now be described. The recipes are intended as examples only, and variation of the species and relative amounts are possible. In one embodiment, the solution placed in the cavity 117 includes 48.75% Urethane diacrylate (UDA), 48.75% Triethylene glycol diacrylate monomer (ETGDA), 1.5% 2,2-dimethoxy-2-phenylacetophenone (DMPA), and 1% tetraethylthiuram disulfide (TED). In another embodiment, the solution includes 50% Polyethylene glycol acrylate (PEG 375), 1% tetraethylthiuram disulfide (TED), and 1.5% Dimethoxyphenylacetone phenone (ADDITOL® BDK). In another embodiment, the solution includes 50% Methoxy Polyethylene Glycol Monoacrylate (CD553), 1% tetraethylthiuram disulfide (TED), and 1.5% Dimethoxyphenylacetone phenone (ADDITOL® BDK). In other embodiments, commercially available thiol-ene, such as NORLAND optical adhesive (NOA 61) may be used with 1% TED.

A second substrate 120 is brought into contact with the spacers 110 and 115 to define another side of the cavity 117: Although shown in FIG. 1 as being brought into contact with the spacers 110 and 115 to define the cavity 117 after the polymer precursor solution is present in the cavity, in some embodiments, the polymer precursor is introduced to the cavity 117 after the second substrate 120 is brought into contact with the spacers 110 and 115. The polymer precursor may be flowed into the cavity 117 using, for example, embodiments of manifolds described below. Any suitable material may be used as the second substrate 120 according to the application contemplated, including but not limited to, glass fused silica, PDMS, and plastic. In some embodiments, the second substrate 120 itself may be formed from a polymerized polymer precursor material containing an iniferter, as described above. The substrate 120 may be polymerized in a mold or other process. The second substrate 120 allows transmission of light into the cavity 117, as is described further below. While the substrates 105 and 120 may be made of a same material, in some embodiments the substrates 105 and 120 contain different materials. The second substrate 120 defines access ports 122 and 124. As described further below, the access ports 122 and 124 may provide access to microchannels formed according to embodiments of the present invention to serve as inlet or outlet ports, or interface with other microfluidic components. The access ports 122 and 124 also provide a mechanism for removing unpolymerized polymer precursor from the device. The access ports may be formed in the substrate 120 by any method, including drilling holes in the substrate 120, etching, embossing, or any other method. Any number of access ports may be provided in any location. In some embodiments, the substrate 120 is first brought into contact with the spacers 110 and 115, and the polymer precursor solution may be introduced into the cavity 117 through the access ports 122 and 124, or both.

The surfaces of the substrates 105 and 120 may be treated to provide anchoring sites for later materials. For example, as described above, the substrates 105 and 124 may themselves be formed by polymerizing an iniferter-containing mixture, resulting in iniferter-capped surfaces. In other embodiments, a surface treatment may be applied to the substrates 105 and 124 such as treatment with a saline, such as 3-(trimethoxysilyl)propyl methacrylate saline. The resulting monomer coating may facilitate covalent attachment to the polymerized material polymerized within the cavity 117. In other embodiments, one or more of the substrates 105 and 120 and spacers 110 and 115 may themselves be formed from the polymerized materials described for filling the cavity 117. Prior to being used as the substrates 105, 120 or spacers 110, 115, the material would be polymerized and, patterned as necessary for use as the substrates 105, 120 or spacers 110, 115. The photopolymerized material may have been formed with a photoiniferter in the polymer precursor solution, such that the surface of the material is reactive and may covalently attach to subsequent materials.

While the use of the spacers 110 and 115 has been described above to set a depth of a microchannel, in some embodiments an adjustable stage and platen may be used to set the depth of the microchannel. The substrate 105 may rest on an adjustable stage which may be adjusted with respect to the substrate 120 to set the depth of a microchannel.

Regions of the polymer precursor solution 117 are selectively exposed to light to polymerize the solution and define a wall of a microchannel. Any light may be used sufficient to initiate polymerization in accordance with the photoinitiator used, including UV light. A beam 130 of light may be applied to the device after focusing by a lens 135. In this manner, a photomask is not needed to mask the regions of the cavity 117 exposed to light. The width of the feature polymerized by the beam 130 is generally defined by exposure to the polymerizing light source and may be 20 µm-50 µm wide, although wider features may also be fabricated by repeated application of the beam 130 to neighboring or overlapping regions, or by a blanket light exposure to a wider source. In other embodiments, a photomask may be used to mask regions of the cavity and expose others to light.

Exposure to the beam 130 polymerizes the exposed polymer precursor, forming a polymerized region 137. The polymerized region 137 defines first and second microchannels 140 and 142. The microchannels 140 and 142 generally may range in dimensions of depth from 1 µm to 1 mm, 1 µm to 500 µm in some embodiments, and 10 µm to 300 µm in other embodiments. The width of the microchannels 140 and 142 generally may range from 10 µm to 1 cm, 25 µm to 1 mm in other embodiments, 25 µm to 500 µm in some embodiments, and 25 µm to 150 µm in other embodiments. Any number of microchannels may be formed, including a single microchannel, and the microchannels need not have a same size. Patterning of the features of devices in embodiments of the present invention occurs by exposing selective regions of the chamber 117 to a polymerizing light source. Any pattern achievable with the polymerizing light source and the polymer precursor may be used. The width and depth of the microchannel are generally selected to obtain the desired, flow characteristics in the channel and provide sufficient volume for the amount of sample or target analytes to be received by the channel. The length of the microchannels generally may range from 25 µm to 10 cm, from 100 µm to 1 cm in other embodiments.

Once desired portions of the liquid polymer precursor have been polymerized by exposure to the polymerizing light source, the unpolymerized solution may be removed through one or more of the access holes 122 and 124 in the substrate 120. The unpolymerized solution may be removed by any available mechanism, including pressure driven flow of solution, or vacuum suction. The unpolymerized solution may be removed from the microchannels 140 and 142 themselves, without removing either of the substrates 120 and 105.

In some embodiments, the polymer precursor solution, or other solvent, may be flushed through one or more of the microchannels 140 and 142 while some or all of the polymerization of the region 137 is occurring. This flushing may facilitate removal of the unpolymerized material because during light exposure, light reflection and free radical propagation may cause partial polymerization of even regions not directly exposed to light. The polymerized or partially polymerized material may also be grafted to the channel walls of the exposed region or surfaces of substrates 120 or 105 resulting in poorly resolved feature definition and partial or full channel occlusion. Even if partial polymerization product is not grafted to channel or substrate regions, the partially polymerized solution may become increasingly viscous. The viscous solution may block the microchannels, making it more difficult or impossible to remove the un- or partially polymerized solution, particularly from smaller microchannels, such as those having a thickness of less than 200 μm. By replacing the partially polymerized solution with fresh unpolymerized solution, or flushing the device with solvent, smaller features may be formed.

In one embodiment, the polymer precursor solution in the cavity 117 is exposed to the light source 130 long enough to begin polymerization of the desired regions, but not long enough to complete polymerization of the region 137. For example, in one embodiment, light exposure occurs for 80-90 percent of the desired polymerization time. In other embodiments, the percentage of complete exposure time used may vary according to the polymer precursor used, the features defined, and other factors. Following this initial exposure, a liquid, such as the polymer precursor solution, deionized water, or a solvent, is moved through one or more of the channels 140 and 142. Solvent may be used for this purpose, but in some embodiments solvent may seep into polymerized channel material. Accordingly, use of polymer precursor solution may be preferred in some embodiments. Any mechanism may be used to move the solution, including pressure-driven flow, pumped, and electrokinetic flow, for example. The solution is generally moved from an inlet to an outlet of the device, although in some embodiments the solution is circulated within the device itself. Exposure to the light source 130 then continues for the remainder of the desired exposure time. The remainder of the exposure may occur while the polymer solution is moving or the polymer solution may not be moved during the remainder of the exposure. By moving the fluid during or between exposures, the removal of the unpolymerized fluid may be improved, and the resultant attainable feature size may also be improved, as the flow of unpolymerized fluid may aid in removing viscous partially polymerized fluid from the vicinity of the polymerized region 137 before it becomes grafter to polymerized features such as walls or substrate material. In some embodiments, a photomask may be used as the upper layer and holes or vias provided in the photomask to allow for flow during photopolymerization. A capping layer may subsequently be added if the photomask is removed.

Following polymerization of the region 137 and removal of the light source, a capping group that was part of the iniferter species included in the polymer precursor solution will be cross-linked with the polymer, and the capping group will be present on the surface of the polymerized region 137, as shown by the layer labeled with "I" in FIG. 1. The surfaces of the micro channels 140 and 142 formed by the substrates 105 and 120 may also have reactive surfaces, as described above. Accordingly, later features, such as polyacrylamide gels, may be formed in the microchannels 140 and 142. Following polymerization of microchannels, the surfaces of the microchannels may be treated to manipulate their surface properties. For example, the device may be subject to a polyelectrolyte, acrylate silane, or other treatment to provide covalent attachment of chemicals to modify the surface or attach functional polymer monoliths.

Embodiments for forming polymer microchannels have been described above. While microchannels were described, embodiments of the present invention may also be used to form chambers, reservoirs, or other features from a polymer precursor solution.

Figure 2:
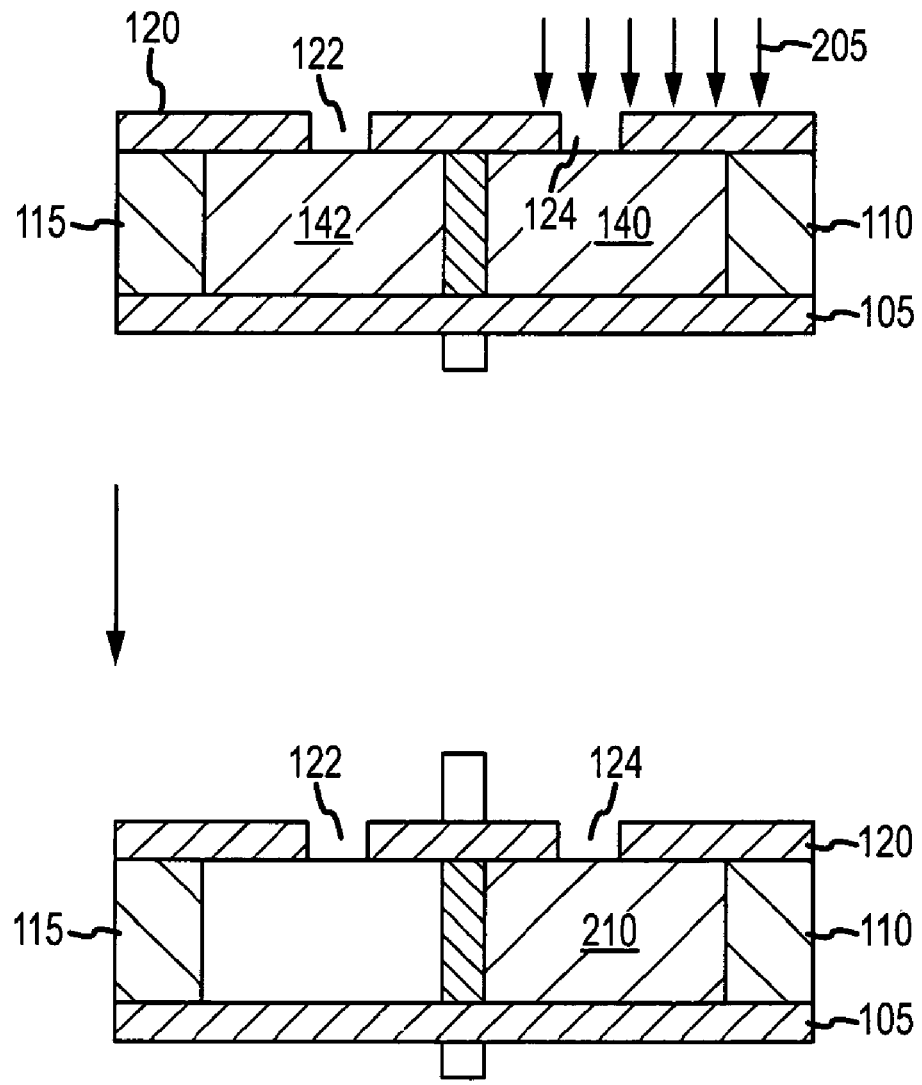
FIG. 2 is a schematic illustration showing cross-sections of a microfluidic device fabricated in accordance with an embodiment of the present invention.

FIG. 2 depicts the formation of a polyacrylamide gel within the microchannel 140. Generally, the gels are formed by introducing an aqueous acrylamide solution including acrylamide monomer, bisacrylamide crosslinker, and a photo initiator into one or more of the micro channels 142, 140. Both the microchannels 142 and 140 are shown filled with the aqueous acrylamide solution in FIG. 2. Regions of the microchannels 142 and 140 are exposed to a source of light, such as the light source 205 to polymerize the gel. The light source 205 may include a blanket exposure to a light source, or a photomask may be used, or a focused light beam as described above. Following exposure to the light source 205, the gel 210 is polymerized in the microchannel 140. Unpolymerized aqueous monomer solution may be removed through access ports in the substrate 120, including the access port 122.

Other microfluidic components may be integrated into microfluidic devices according to embodiments of the present invention including pumps, valves, reservoirs, inlets, outlets, mixing chambers, and channels. The other microfluidic components may connect to the channels shown in FIGS. 1 and 2 through the access ports 122 and 124, or both.

Figure 3:
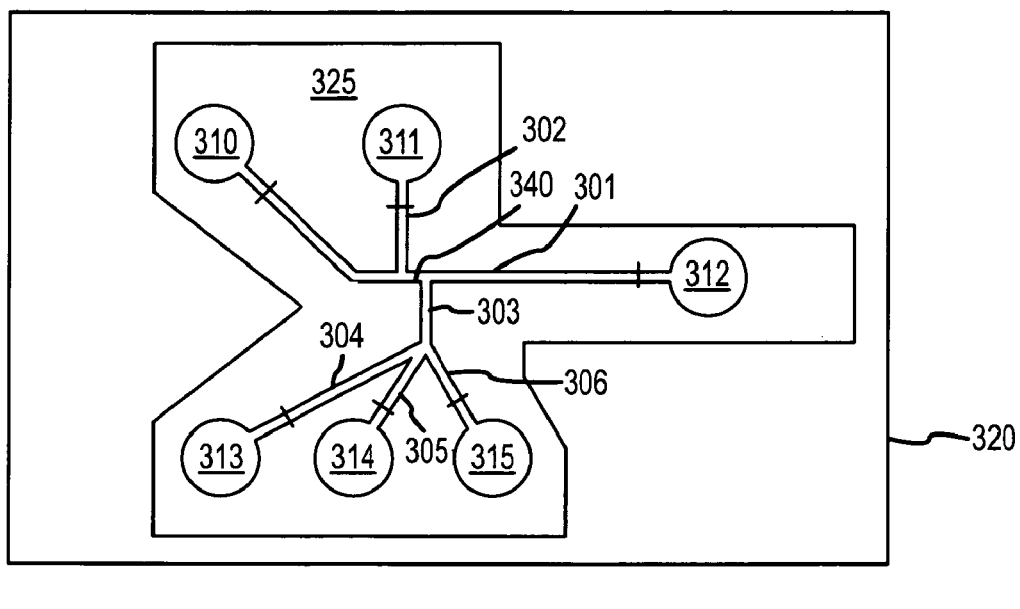
FIG. 3 is a schematic illustration showing a top-down view of a microfluidic device according to an embodiment of the present invention.

A top-down view of a microfluidic device 300 according to an embodiment of the present invention is shown in FIG. 3. Microchannels 301, 302, 303, 304, 305, and 306 may be formed in accordance with the above-described methods. Chambers 310, 311, 312, 313, 314, and 315 may also be formed. The micro channels 301, 302, 303, 304, 305, and 306 and chambers 310, 311, 312, 313, 314, and 315 represent unexposed regions where unpolymerized polymer has been removed from the device 300. The spacer material 320 is shown, and the material 325 defining the microchannels and chambers includes the polymerized solution, as described above.

As was described above, to facilitate the patterning of smaller features, un- or partially polymerized solution may be replaced during light exposure with fresh unpolymerized polymer precursor solution. In one embodiment, light exposure occurs sufficient to partially polymerize (about 50-75% cross-linking) the material 325. In one embodiment; this corresponds to an exposure of 90 seconds. The unexposed regions are less polymerized, but may have become more viscous due to reflections or free radical migration. Fresh polymer precursor solution is then fed into the device 300 from the chamber 310 to one or more of the chambers 311, 312, 313, 314, and 315. During or after the replacement of the solution, the material 325 is again exposed to light to complete the polymerization, and the remaining liquid flushed from the device. In some embodiments, polymer precursor solution may be continuously flowed from the chamber 310 to one or more of the other chambers 311, 312, 313, 314, and 315, during light exposure to polymerize the material 325.

In another embodiment, rather than flowing fresh polymer precursor solution continuously through the device 300, a solvent wash is performed between the initial and final exposures. A solvent is flowed through the features between the chamber 310 and one or more of the chambers 311, 312, 313, 314, and 315. Following solvent wash, the device is exposed to the final curing light exposure, in one embodiment a 300 second exposure.

One or more of the microchannels 301, 302, 303, 304, 305, and 306 may be partially or completely filled with a polyacrylamide gel using embodiments of the process described above. The gel-filled microchannels may be used for a variety of applications, such as the separation of target analytes for detection using electrophoretic separation techniques. Additionally, one or more polyacrylamide membranes may be fabricated in the channels, such as the membrane 340. The membrane 340 may serve as a size exclusion membrane, preventing analytes of greater than a threshold size from passing from the chamber 310 to the chambers 312, 313, 314, and 315.

Figure 4:
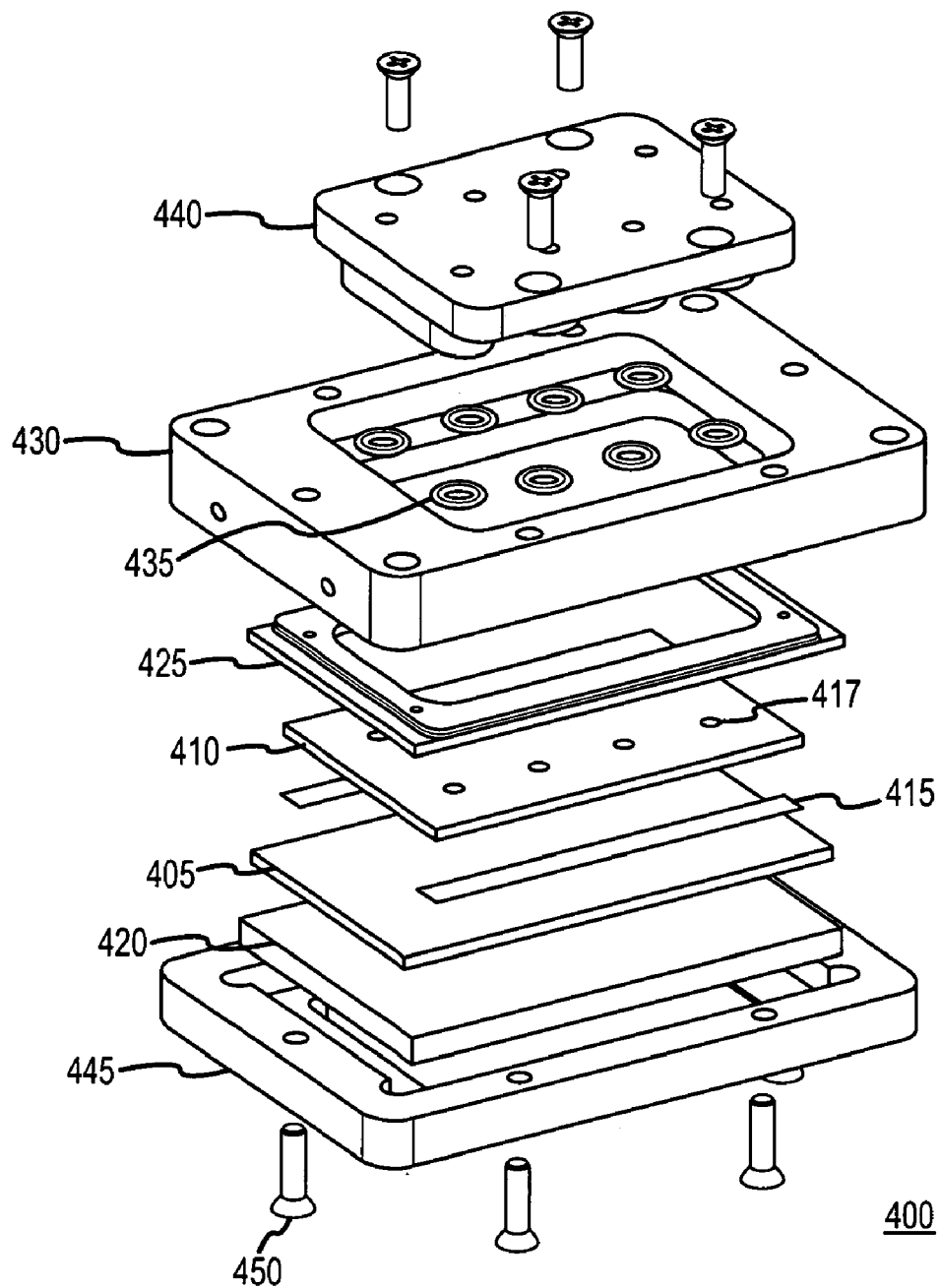
FIG. 4 is a schematic illustration of an exploded view of a manifold structure according to an embodiment of the present invention.

Embodiments of methods for making polymerized microfluidic devices have been described above. The methods may remove partially or unpolymerized solution from the polymerized device itself, through access ports in one or more, device surfaces. Some methods include flushing a partially polymerized device with solvent or fresh polymer solution. To facilitate fluid transport into and out of the device, a manifold structure may be used. An embodiment of a manifold structure 400 for use with devices of the present invention is shown in FIG. 4. Referring to FIG. 4, microstructures will be formed in the cavity defined by the first substrate 405, the second substrate 410, and the spacers 415. The second substrate 410 includes several access ports, including an access port 417. The substrate and spacers are formed from materials as described above. However, in the embodiment shown in FIG. 4, as will be described further below, light exposure of the cavity formed by the substrates 405, 410 and spacers 415 will be conducted through the first substrate 405, not through the second substrate 410 with the access ports. That is, in FIG. 4, the light exposure will be coming up from the bottom of the manifold structure 400 shown. In other embodiments, the light exposure may come from the top of the structure 400 and the materials used adjusted for appropriate transparency.

A photomask 420 for defining the regions of polymerization may be included in the manifold structure 400. In other embodiments, the photomask 420 may not be included in the structure 400, but the structure 400 may be placed on, under, or near the photomask 420 for exposure. In other embodiments, a shaped light beam may be used and no photomask may be required. A silicon gasket 425 provides a fluid seal between the substrate 410 having the access ports and a monomer injection block 430. The monomer injection block 430 includes a housing having access ports corresponding to the access ports in the substrate 410. A one-to-one correspondence between ports is not required, but may be provided. The monomer injection block 430 accordingly may provide a convenient mechanism for interfacing with the access ports in the substrate 410. A fluid manifold provides access to each of the access ports in the substrate 410 through the injection block 430. Accordingly, fluid connectors such as tubing, syringes, reservoirs, and other fluid containers or connectors or fluid controllers such as valves and pumps may be connected to the manifold 440 for supplying fluid to the cavity formed by the substrates 405, 410 and spacers 415, or removing fluid from the cavity.

The components in FIG. 4 may be held together by a compression frame 445 that couples to the monomer injection block 430 and manifold 440 with screws 450. The screws 450 serve to apply a compression force to the layers, sealing the device. In this manner, fluid, such as solvent or polymer precursor solution may be delivered through one or more access ports into the cavity formed by the substrates 405, 410 and the spacers 415. Similarly, fluid, such as solvent or partially polymerized precursor solution, may be removed through one or more access ports. Additionally, the supply and removal of fluid may occur as the device is exposed to a light source and polymerization is underway.

Once microchannels or chambers are defined within the cavity, hydrogels may be formed in the features as described above. The manifold structure 400 may also be used to introduce aqueous acrylamide solution into the device, pattern the gels, and remove the excess solution from the device.

From the foregoing it will be appreciated that, although specific embodiments of the invention have been described herein for purposes of illustration, various modifications may be made without deviating from the spirit and scope of the invention.

What is claimed is:

1. A method for fabricating a microfluidic device, the method comprising:
   defining a cavity, the cavity having an access port, and wherein the cavity is defined by a first substrate, a second substrate, and a spacer;
   filling the cavity with a polymer precursor solution, the polymer precursor solution including a monomeric species, a photoinitiator, and an iniferter;
   polymerizing a region of the polymer precursor solution to at least partially define a microchannel;
   removing excess polymer precursor solution from the cavity through the access port; and
   wherein the first and second substrates comprise a polymerized solution, at least one surface of each of the first and second substrates being capped with an iniferter.

2. The method according to claim 1, wherein the monomeric species comprises diacrylate.

3. The method according to claim 1, wherein the iniferter comprises a tetraethylthiuram disulfide (TED) solution.

4. The method according to claim 1 wherein the act of polymerizing the region comprises exposing the region to a light source.

5. The method according to claim 1, wherein the act of polymerizing the region comprises partially polymerizing the region, the method further comprising:
   flowing a solvent solution through the microchannel after partially polymerizing the region;
   placing the polymer precursor solution in the microchannel after flowing the solvent solution through the microchannel; and
   completing the polymerization of the region.

6. The method according to claim 5, wherein the act of polymerizing the region comprises exposing the region to a light source for 50 to 75 percent of a time required for complete polymerization.

7. The method according to claim 1, wherein the act of polymerizing the region comprises partially polymerizing the region, the method further comprising:
   flowing fresh polymer precursor solution through the microchannel; and
   completing the polymerization of the region.

8. The method according to claim 7, wherein the act of flowing fresh polymer precursor solution through the micro channel occurs during the act of completing the polymerization of the region.

9. The method according to claim 7, wherein the act of partially polymerizing the region comprises exposing the region to a light source for 50 to 75 percent of a time required for complete polymerization.

10. The method according to claim 1, further comprising placing an aqueous acrylamide solution in the microchannel and exposing the aqueous acrylamide solution to a light source, thereby forming a polyacrylamide gel in the microchannel.

11. The method according to claim 10, further comprising removing excess acrylamide solution through the access port.

12. The method according to claim 10, wherein at least one surface of the microchannel is capped by an iniferter species following polymerization of the region, the act of exposing the aqueous acrylamide solution to the light source comprising activating the iniferter to promote binding acrylamide to the microchannel surface.

13. The method according to claim 1, wherein at least one dimension of the micro channel is less than 200 μm.

* * * * *